(12) United States Patent
Masuda

(10) Patent No.: US 12,719,466 B2
(45) Date of Patent: Aug. 25, 2026

(54) VEHICLE-MOUNTED SEMICONDUCTOR SWITCH DEVICE

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventor: Kazuki Masuda, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 369 days.

(21) Appl. No.: 18/684,932

(22) PCT Filed: Aug. 25, 2021

(86) PCT No.: PCT/JP2021/031121

§ 371 (c)(1),
(2) Date: Feb. 20, 2024

(87) PCT Pub. No.: WO2023/026388

PCT Pub. Date: Mar. 2, 2023

(65) Prior Publication Data

US 2024/0429911 A1 Dec. 26, 2024

(51) Int. Cl.
*H03K 17/0812* (2006.01)
*H10W 70/40* (2026.01)
*H10W 74/10* (2026.01)

(52) U.S. Cl.
CPC .... *H03K 17/08122* (2013.01); *H10W 70/424* (2026.01); *H10W 74/111* (2026.01)

(58) Field of Classification Search
None
See application file for complete search history.

(56) References Cited

U.S. PATENT DOCUMENTS 4,114,627 A * 9/1978 Lewyn ................ A61N 1/3712 607/28
7,319,579 B2 * 1/2008 Inoue .................... H02H 9/041 361/117

(Continued)

FOREIGN PATENT DOCUMENTS

CN 102856309 A * 1/2013 .......... H10W 70/481
CN 114080673 A * 2/2022 ............ H10W 90/00

(Continued)

OTHER PUBLICATIONS

International Search Report, Application No. PCT/JP2021/031121, mailed Oct. 26, 2021. ISA/Japan Patent Office.

*Primary Examiner* — Michael Lebentritt
(74) *Attorney, Agent, or Firm* — Brooks Kushman P.C.

(57) ABSTRACT

A vehicle-mounted semiconductor switch device includes a semiconductor switch that is controlled by an ON signal and an OFF signal output from an vehicle-mounted drive circuit and that is switched between an ON state and an OFF state between a first conductive path and a second conductive path. The vehicle-mounted semiconductor switch device further includes a voltage detection unit. The semiconductor switch includes a first lead portion electrically connected to the first electrode, and a conductor portion electrically connected to the first electrode. One of the conductor portion and the first lead portion is bonded to the first conductive path, and the other is bonded to a first voltage detection path. A voltage detection unit detects a voltage applied to the first voltage detection path.

11 Claims, 5 Drawing Sheets

(56) References Cited

U.S. PATENT DOCUMENTS

| | | | |
|---|---|---|---|
| 2008/0012045 | A1 | 1/2008 | Muto et al. |
| 2008/0265386 | A1 | 10/2008 | Muto et al. |
| 2020/0066620 | A1 | 2/2020 | Kanetake et al. |

FOREIGN PATENT DOCUMENTS

| | | | | | |
|---|---|---|---|---|---|
| EP | 3282479 | A1 | * | 2/2018 | .......... H10W 44/501 |
| JP | 2004-357440 | A | | 12/2004 | |
| JP | 2017-174951 | A | | 9/2017 | |
| JP | 2019-198171 | A | | 11/2019 | |
| WO | WO-2019131222 | A1 | * | 7/2019 | ......... H05K 7/14322 |
| WO | WO-2023026388 | A1 | * | 3/2023 | .......... H10W 74/111 |
| WO | WO-2023026389 | A1 | * | 3/2023 | ............ H10W 74/40 |

* cited by examiner

VEHICLE-MOUNTED SEMICONDUCTOR SWITCH DEVICE

CROSS-REFERENCE TO RELATED APPLICATIONS

This application is the U.S. national stage of PCT/JP2021/031121 filed on Aug. 25, 2022, the contents of which are incorporated herein.

TECHNICAL FIELD

The present disclosure relates to a vehicle-mounted semiconductor switch device.

BACKGROUND

JP 2004-357440A discloses a battery pack. The battery pack includes a battery, a protection FET connected in series to the battery, and a voltage detection circuit that detects a voltage between the drain and source of the FET. This battery pack detects an overcurrent based on the voltage detected by the voltage detection circuit, and blocks a current flowing through the FET.

In this type of technique, when detecting a voltage between electrodes (for example, between a drain and a source), it is assumed that a voltage of a lead portion electrically connected to an electrode (for example, a drain electrode) or a voltage of a conductive path to which the lead portion is connected is detected. However, in this case, a counter electromotive force Ls·di/dt based on an inductance component Ls of the path and a temporal change di/dt of the current i is generated in the path between the detection position and the electrode. In other words, the voltage detected by the voltage detection circuit is affected by the counter electromotive force caused by the inductance component Ls of the path. Therefore, there is a concern that a problem due to the influence of the counter electromotive force may occur, for example, in a configuration in which an overcurrent is detected based on a voltage change and a current is blocked, blocking of the current may be delayed.

The present disclosure provides a technique capable of detecting a voltage between electrodes while suppressing the influence of a counter electromotive force caused by an inductance component of a path.

SUMMARY

A vehicle-mounted semiconductor switch device according to the present disclosure includes a semiconductor switch that is controlled by an ON signal and an OFF signal output from a vehicle-mounted drive circuit and that is switched between an ON state and an OFF state between a first conductive path and a second conductive path, and the vehicle-mounted semiconductor switch device further includes a voltage detection unit, wherein the semiconductor switch includes a semiconductor portion, a first electrode, a second electrode, a third electrode to which the ON signal and the OFF signal are input from the drive circuit, a sealing body covering the semiconductor portion, a first lead portion electrically connected to the first electrode and protruding to the outside of the sealing body, a second lead portion electrically connected to the second electrode and protruding to the outside of the sealing body, and a conductor portion configured as a part of the first electrode or electrically connected to the first electrode and exposed to the outside of the sealing body, the semiconductor switch is in the ON state in which the semiconductor switch allows a current to flow from the first electrode side to the second electrode side when the ON signal is input to the third electrode, and is in the OFF state in which the semiconductor switch blocks a current from flowing from the first electrode side to the second electrode side when the OFF signal is input to the third electrode, one of the conductor portion and the first lead portion is bonded to the first conductive path, and the other is bonded to a first voltage detection path, and the voltage detection unit detects a voltage applied to the first voltage detection path.

Advantageous Effects

According to the present disclosure, it is possible to detect a voltage between electrodes while suppressing the influence of a counter electromotive force caused by an inductance component of a path.

DETAILED DESCRIPTION OF PREFERRED EMBODIMENTS

Figure 1:
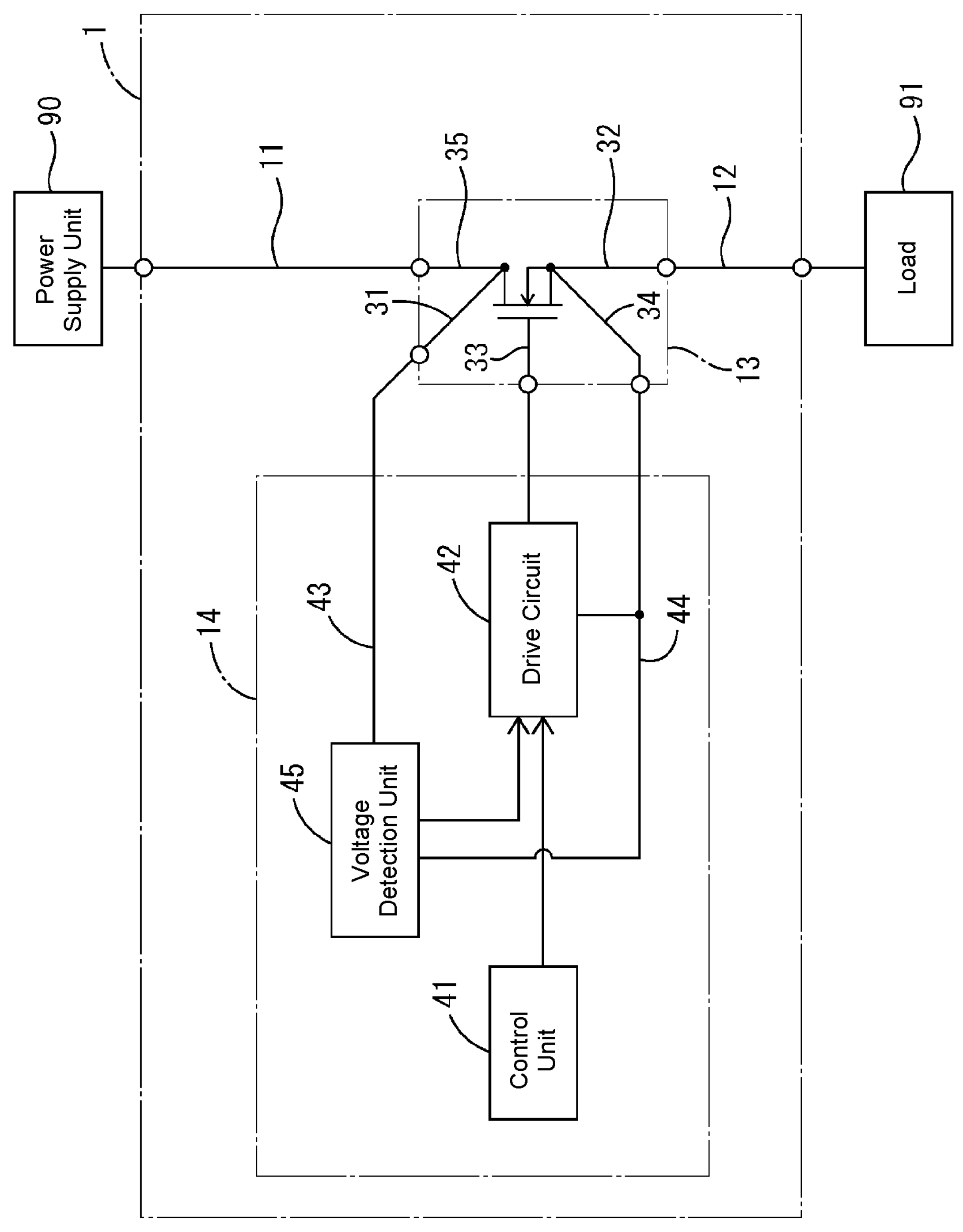
FIG. 1 is a circuit diagram schematically showing a configuration of a vehicle-mounted semiconductor switch device.

In the following, embodiments of the present disclosure are listed and exemplified.

A vehicle-mounted semiconductor switch device of the present disclosure including a semiconductor switch that is controlled by an ON signal and an OFF signal output from an vehicle-mounted drive circuit and that is switched between an ON state and an OFF state between a first conductive path and a second conductive path, the vehicle-mounted semiconductor switch device further including a voltage detection unit, wherein the semiconductor switch includes a semiconductor portion, a first electrode, a second electrode, a third electrode to which the ON signal and the OFF signal are input from the drive circuit, a sealing body covering the semiconductor portion, a first lead portion electrically connected to the first electrode and protruding to the outside of the sealing body, a second lead portion electrically connected to the second electrode and protruding to the outside of the sealing body, and a conductor portion configured as a part of the first electrode or electrically connected to the first electrode and exposed to the outside of the sealing body, the semiconductor switch is in the ON state in which the semiconductor switch allows a current to flow from the first electrode side to the second electrode side when the ON signal is input to the third electrode, and is in the OFF state in which the semiconductor switch blocks a current from flowing from the first electrode side to the second electrode side when the OFF signal is input to the third electrode, one of the conductor portion and the first lead portion is bonded to the first conductive path, and the other is bonded to a first voltage detection path, and the voltage detection unit detects a voltage applied to the first voltage detection path.

In the vehicle-mounted semiconductor switch device, one of the conductor portion and the first lead portion functions as a current path, and the other is used for voltage detection. Therefore, it is easy to adopt a configuration in which the inductance component between the first electrode and the first voltage detection path is suppressed. In other words, according to this configuration, it is easy to adopt a configuration in which the voltage between the first electrode and the second electrode is detected while suppressing the influence of the counter electromotive force caused by the inductance component between the first electrode and the first voltage detection path.

The first lead portion may be bonded to the first voltage detection path, and the conductor portion may be bonded to the first conductive path.

According to this configuration, because the first lead portion which is easily bent is bonded to the first voltage detection path, it is possible to increase the degree of freedom of the arrangement position of the first voltage detection path.

The first lead portion and the conductor portion may be integrally formed.

In the configuration in which the first lead portion and the conductor portion are integrally formed, when the first lead portion is bonded to the first conductive path and the first voltage detection path is bonded to the first lead portion or the first conductive path, a current flows through both the conductor portion and the first lead portion, and thus the semiconductor switch device is affected by a counter electromotive force caused by inductance components of both the conductor portion and the first lead portion. In contrast, in the present configuration, because the first lead portion is bonded to the first voltage detection path and the conductor portion is bonded to the first conductive path, a current flowing from the first conductive path to the second conductive path does not pass through the first lead portion, and as a result, the semiconductor switch device is not affected or is less likely to be affected by the counter electromotive force caused by the inductance component of the first lead portion. Accordingly, the influence of the counter electromotive force caused by the inductance component between the first electrode and the first voltage detection path can be more reliably suppressed.

The conductor portion may have a plate shape, and a surface on one side of the conductor portion in a thickness direction may be bonded to the first conductive path.

According to this configuration, the inductance component of the conductor portion is easily suppressed, and thus the inductance component between the first electrode and the voltage detection circuit is easily suppressed. In addition, according to this configuration, heat generated in the semiconductor switch is easily released from the conductor portion to the first conductive path.

A width of an exposed surface of the conductor portion exposed to the outside of the sealing body may be larger than a width of the first lead portion.

According to this configuration, the inductance component of the conductor portion is easily suppressed, and thus the inductance component between the first electrode and the voltage detection circuit is easily suppressed. In addition, according to this configuration, heat generated in the semiconductor switch is easily released from the conductor portion to the first conductive path.

The voltage detection unit may output a block signal when the voltage applied to the first voltage detection path is a predetermined abnormal voltage, and the drive circuit may output the OFF signal when the block signal is input thereto.

According to this configuration, a voltage can be detected while suppressing the influence of the counter electromotive force caused by the inductance component between the first electrode and the first voltage detection path, and the OFF signal can be output from the drive circuit when the detected voltage is an abnormal voltage. Therefore, when an abnormality occurs in the voltage of the first electrode, the semiconductor switch can be switched to the OFF state more quickly.

First Embodiment

A vehicle-mounted semiconductor switch device 1 (hereinafter, also referred to as a "semiconductor switch device 1") shown in FIG. 1 is a device to be mounted in a vehicle such as an automobile. The semiconductor switch device 1 includes a first conductive path 11, a second conductive path 12, a semiconductor switch 13, and a circuit board 14.

The first conductive path 11 and the second conductive path 12 are provided between a power supply unit 90 and a load 91 mounted on a vehicle, and function as a part of a power path for supplying power from the power supply unit 90 to the load 91. A semiconductor switch 13 is provided between the first conductive path 11 and the second conductive path 12. As shown in FIG. 1, the first conductive path 11 is arranged closer to the power supply unit 90 than the semiconductor switch 13 is. The second conductive path 12 is arranged closer to the load 91 than the semiconductor switch 13 is.

The semiconductor switch 13 is a semiconductor switching element that is controlled by an ON signal and an OFF signal output from the drive circuit 42 described later, and switches between an ON state and an OFF state between the first conductive path 11 and the second conductive path 12. In the present embodiment, the semiconductor switch 13 is an FET, more specifically, an N-channel type metal oxide semiconductor field effect transistor (MOSFET), but may also be another semiconductor switching element such as an insulated gate bipolar transistor (IGBT).

Figure 2:
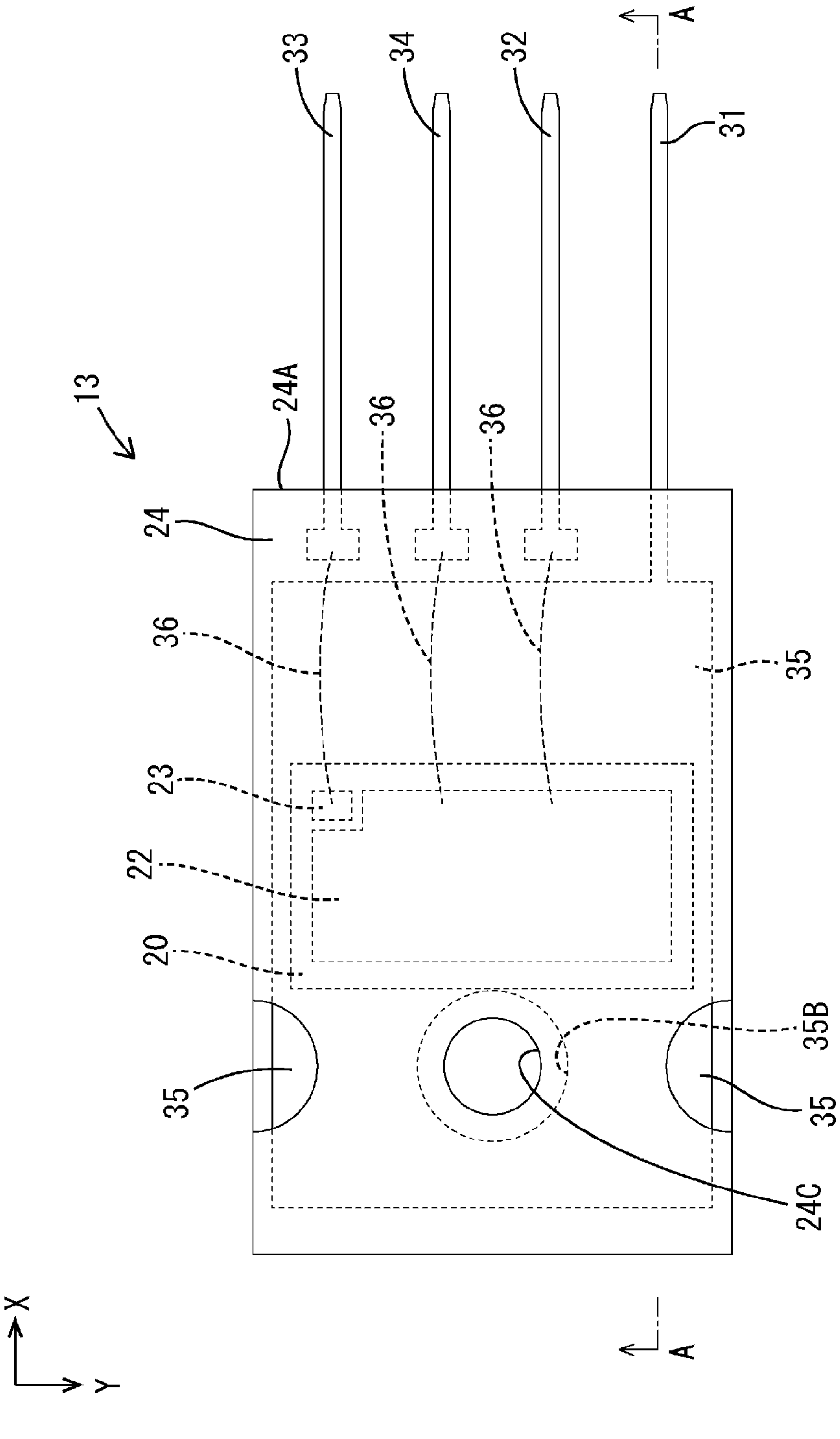
FIG. 2 is a plan view of a semiconductor switch.
Figure 3:
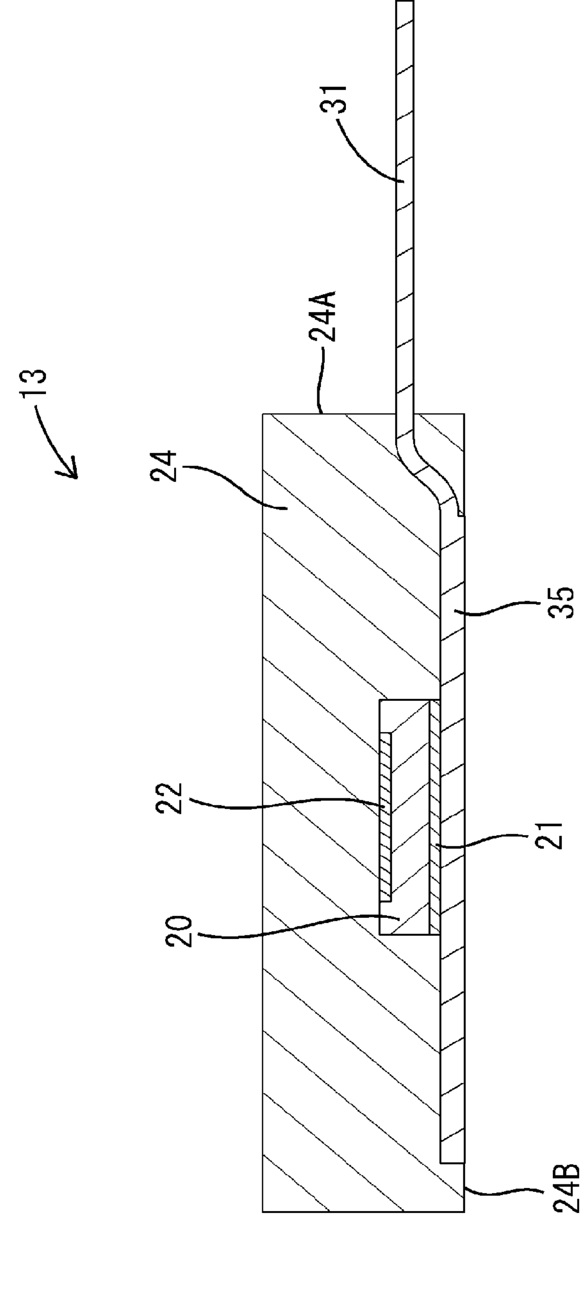
FIG. 3 is a cross-sectional view taken along line A-A of FIG. 2.
Figure 3:
Figure 4:
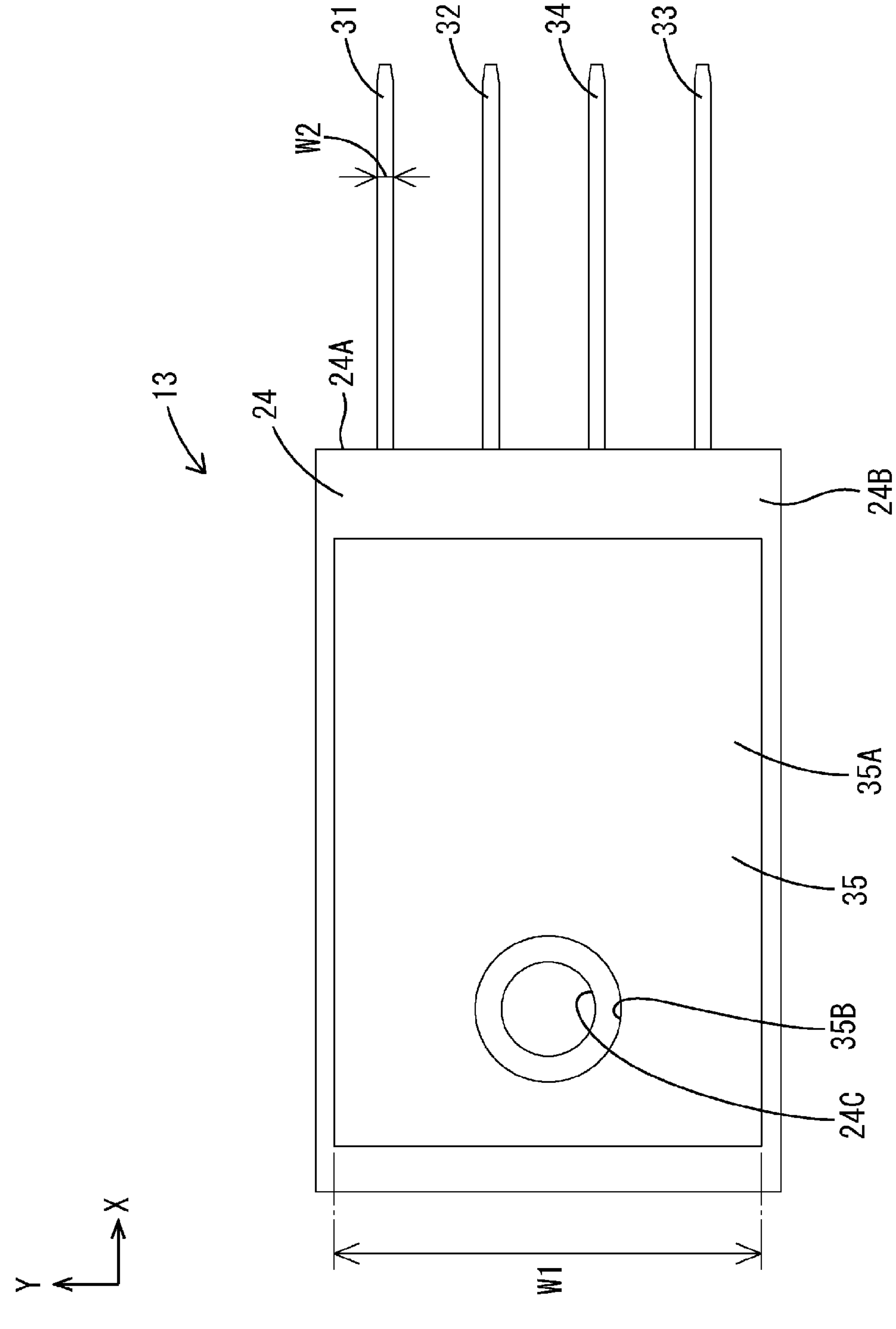
FIG. 4 is a bottom view of the semiconductor switch.

As shown in FIGS. 2 to 4, the semiconductor switch 13 includes a semiconductor portion 20, a first electrode 21, a second electrode 22, a third electrode 23, a sealing body 24, a first lead portion 31, a second lead portion 32, a third lead portion 33, a fourth lead portion 34, and a conductor portion 35. The semiconductor switch 13 has a flat shape. In the present embodiment, the thickness direction of the semiconductor switch 13 is defined as a Z-direction, the width direction is defined as a Y-direction, and a direction intersecting (more specifically, orthogonal to) the Z-direction and the Y-direction is defined as an X-direction.

The semiconductor portion 20 is made of a semiconductor material such as Si or SiC. The semiconductor portion 20 includes a first semiconductor region (a drain region in the embodiment) and a second semiconductor region (a source region in the embodiment) arranged at a position different from the first semiconductor region. The semiconductor portion 20 has a flat shape. The thickness direction of the semiconductor portion 20 is along the Z-direction, and more specifically, is the same as the Z-direction.

The first electrode 21, the second electrode 22, and the third electrode 23 are each configured as an electrode layer. The thickness direction of the first electrode 21, the second electrode 22, and the third electrode 23 is along the Z-direction, and more specifically, is the same as the Z-direction.

The first electrode 21 is a drain electrode in the present embodiment and is electrically connected to the first semiconductor region of the semiconductor portion 20. The second electrode 22 is a source electrode in the present embodiment and is electrically connected to the second semiconductor region of the semiconductor portion 20. The third electrode 23 is a gate electrode in the present embodiment, and receives an ON signal and an OFF signal from a later-described drive circuit 42. The first electrode 21 is arranged on one side of the semiconductor portion 20 in the Z-direction, and the second electrode 22 and the third electrode 23 are arranged on the other side of the semiconductor portion 20 in the Z-direction. In other words, the semiconductor portion 20 is arranged between the first electrode 21, and the second electrode 22 and the third electrode 23. The semiconductor switch 13 is in an ON state in which a current is allowed to flow from the first electrode 21 side to the second electrode 22 side when an ON signal is input to the third electrode 23, and is in an OFF state in which a current is blocked from flowing from the first electrode 21 side to the second electrode 22 side when an OFF signal is input to the third electrode 23.

The sealing body 24 covers the semiconductor portion 20, the first electrode 21, the second electrode 22, and the third electrode 23. The sealing body 24 has an insulating property. The sealing body 24 is made of, for example, a synthetic resin. The sealing body 24 is molded by, for example, a transfer method. The sealing body 24 has a flat shape. The thickness direction of the sealing body 24 is along the Z-direction, and more specifically, is the same as the Z-direction. The sealing body 24 has a first surface 24A and a second surface 24B. The first surface 24A is a surface on one side of the sealing body 24 in the X-direction. The second surface 24B is a surface provided at a position different from the first surface 24A, and more specifically, is a surface on one side of the sealing body 24 in the Z-direction. The sealing body 24 has a first through hole 24C penetrating the sealing body 24 in the Z-direction (thickness direction). The first through hole 24C has a circular cross section. A screw (not shown) can be inserted into the first through hole 24C, and the semiconductor switch 13 can be screwed.

The first lead portion 31, the second lead portion 32, the third lead portion 33, and the fourth lead portion 34 are each made of metal and have an elongated shape. The first lead portion 31, the second lead portion 32, the third lead portion 33, and the fourth lead portion 34 protrude from the sealing body 24 to one side in the X-direction. The first lead portion 31, the second lead portion 32, the third lead portion 33, and the fourth lead portion 34 are arranged side by side along the Y-direction. In other words, the first lead portion 31, the second lead portion 32, the third lead portion 33, and the fourth lead portion 34 are arranged side by side along the width direction of the semiconductor switch 13.

The first lead portion 31 is a drain terminal in the present embodiment. The first lead portion 31 is electrically connected to the first electrode 21 and protrudes from the first surface 24A of the sealing body 24 to the outside of the sealing body 24. The first lead portion 31 is electrically connected to the conductor portion 35. The first lead portion 31 and the conductor portion 35 are integrally formed of the same member. The first lead portion 31 is electrically connected to the first electrode 21 via the conductor portion 35.

The second lead portion 32 and the fourth lead portion 34 are source terminals in the present embodiment. The second lead portion 32 and the fourth lead portion 34 are electrically connected to the second electrode 22 via wires 36, and protrude from the first surface 24A of the sealing body 24 to the outside of the sealing body 24. The second lead portion 32 and the fourth lead portion 34 are arranged between the first lead portion 31 and the third lead portion 33 in the Y-direction.

The third lead portion 33 is a gate terminal in the present embodiment. The third lead portion 33 is electrically connected to the third electrode 23 via a wire 36 and protrudes from the first surface 24A of the sealing body 24 to the outside of the sealing body 24.

The conductor portion 35 is made of metal and has a plate shape. The thickness direction of the conductor portion 35 is along the Z-direction, and more specifically, is the same as the Z-direction. In other words, the thickness direction of the conductor portion 35 is along the thickness direction of the sealing body 24, and more specifically, is the same direction as the thickness direction of the sealing body 24. The conductor portion 35 is configured as a separate body from the first electrode 21, and is electrically connected to the first electrode 21. The surface of the conductor portion 35 on the other side in the Z-direction is bonded to the first electrode 21. Note that in this specification, "bonded" includes not only a structure in which components are bonded to each other in series, but also a structure in which components are bonded to each other through another conductive layer. The thickness direction of the conductor portion 35 is along the thickness direction of the first electrode 21, and more specifically, is the same direction as the thickness direction of the first electrode 21. In other words, the conductor portion 35 and the first electrode 21 overlap each other. The semiconductor portion 20 and the first electrode 21 are arranged on the other side of the conductor portion 35 in the Z-direction. The conductor portion 35 is exposed to the outside from the second surface 24B of the sealing body 24. The conductor portion 35 has an exposed surface 35A that is exposed to the outside of the sealing body 24. The exposed surface 35A is arranged in a state of facing one side in the Z-direction. The exposed surface 35A has a width W1 that is larger than a width W2 of the first lead portion 31. The conductor portion 35 functions as a heat dissipation plate that dissipates heat generated in the semiconductor portion 20 to the outside of the sealing body 24. The conductor portion 35 has a second through hole 35B penetrating the conductor portion 35 in the Z-direction (thickness direction). The second through hole 35B has a circular cross section. The diameter of the second through hole 35B is larger than the diameter of the first through hole 24C of the sealing body 24. The inner circumferential surface of the second through hole 35B is arranged radially outward of the inner circumferential surface of the first through hole 24C.

Figure 5:
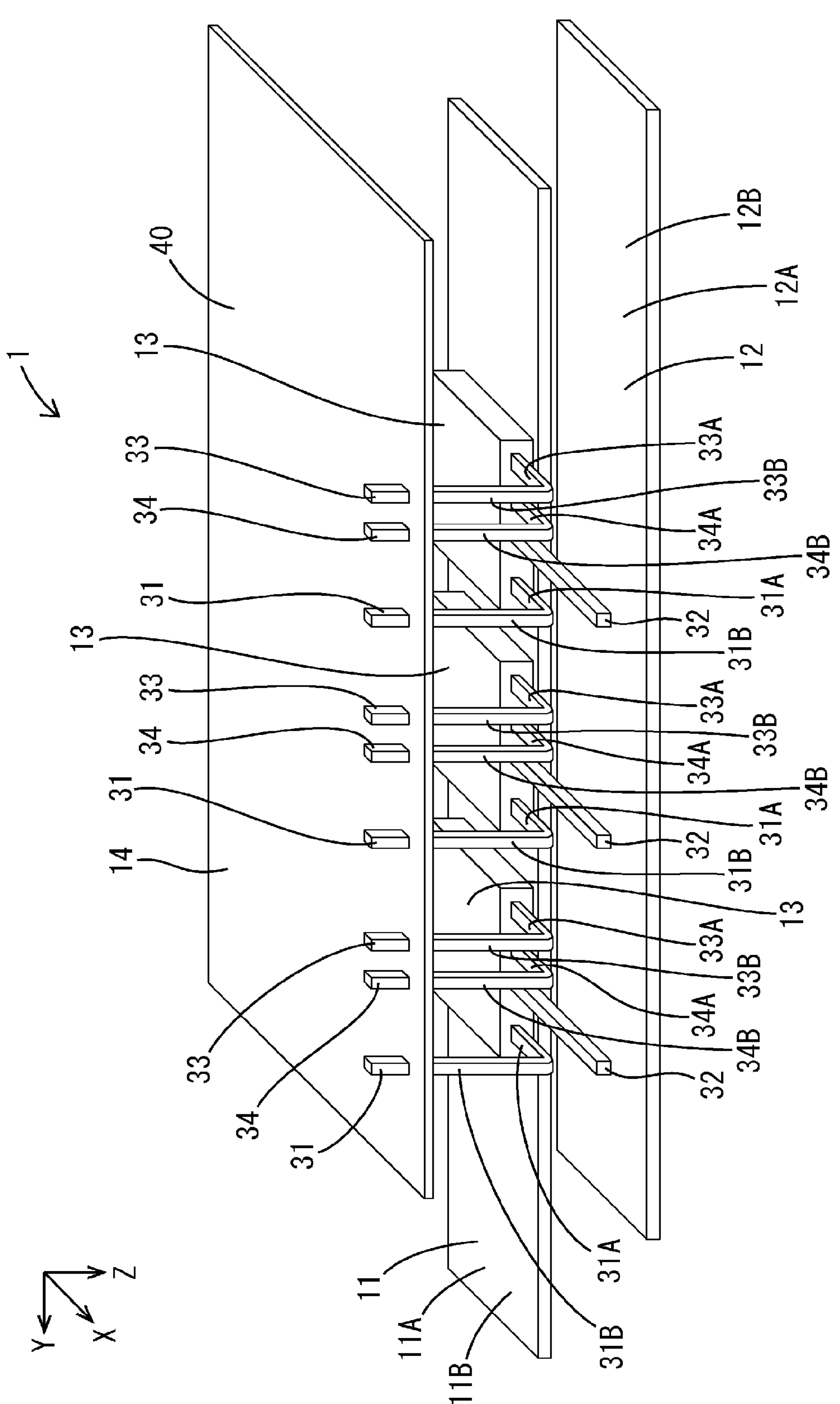
FIG. 5 is a perspective view of the vehicle-mounted semiconductor switch device.

The circuit board 14 can control the semiconductor switch 13. As shown in FIGS. 1 and 5, the circuit board 14 includes a substrate 40, a control unit 41, a drive circuit 42, a first voltage detection path 43, a second voltage detection path 44, and a voltage detection unit 45. The substrate 40 is made of, for example, a synthetic resin and has a plate shape. Wiring patterns are formed on the substrate 40. The control unit 41, the drive circuit 42, the first voltage detection path 43, the second voltage detection path 44, and the voltage detection unit 45 are mounted on the substrate 40.

The control unit 41 is mainly configured by, for example, a microcomputer, and includes a CPU, a RAM, a ROM, and the like. The control unit 41 provides a drive signal to the drive circuit 42 when the drive condition is satisfied. When the drive signal is provided, the drive circuit 42 outputs an ON signal to the third electrode 23 of the semiconductor switch 13. When the ON signal is input to the third electrode 23, the semiconductor switch 13 is in the ON state, and a current flows from the first electrode 21 side to the second electrode 22 side. As a result, the electric power based on the power supply unit 90 is supplied to the load 91. The drive condition is not particularly limited, and may also be, for example, that a start switch of the vehicle is switched to an ON state, or that a start operation is performed by a user of the vehicle. The start switch is an ignition switch in the case of an engine-mounted vehicle, and is a power switch in the case of an electric vehicle. The control unit 41 can recognize the ON/OFF state of the start switch of the vehicle and the operation result of the user, based on a signal that is input from, for example, an external electronic control unit (ECU).

The control unit 41 provides a stop signal to the drive circuit 42 when a stop condition is satisfied. When the stop signal is provided, the drive circuit 42 outputs an OFF signal to the third electrode 23 of the semiconductor switch 13. When the OFF signal is input to the third electrode 23, the semiconductor switch 13 is in the OFF state, and the flow of the current from the first electrode 21 side to the second electrode 22 side is blocked. As a result, the power supply from the power supply unit 90 to the load 91 is blocked. The stop condition is not particularly limited, and may also be, for example, that the start switch of the vehicle is switched to an OFF state, or that a stop operation is performed by the user of the vehicle.

The voltage detection unit 45 is configured to include, for example, a known voltage detection circuit, and detects a voltage between the first voltage detection path 43 and the second voltage detection path 44. The first voltage detection path 43 is electrically connected to the first electrode 21, and the second voltage detection path 44 is electrically connected to the second electrode 22. Accordingly, the voltage detection unit 45 can detect the voltage between the first electrode 21 and the second electrode 22. The voltage detection unit 45 determines whether the voltage between the first electrode 21 and the second electrode 22 is a threshold voltage or lower. The voltage detection unit 45 outputs a block signal to the drive circuit 42 when it is determined that the voltage between the first electrode 21 and the second electrode 22 is the threshold voltage or lower. When the block signal is input, the drive circuit 42 outputs an OFF signal even in a state where a drive signal is input to the drive circuit 42. In other words, when the voltage between the first electrode 21 and the second electrode 22 drops to the threshold voltage or lower, an OFF signal is input from the drive circuit 42 to the third electrode 23. As a result, the semiconductor switch 13 is in the OFF state.

The following description relates to the connection structure of the semiconductor switch 13.

As shown in FIG. 5, the first conductive path 11 and the second conductive path 12 are arranged on one side of the semiconductor switch 13 in the Z-direction, and the circuit board 14 is arranged on the other side of the semiconductor switch 13 in the Z-direction.

The first conductive path 11 includes a first bus bar 11A. The first bus bar 11A has a plate shape. The second conductive path 12 includes a second bus bar 12A. The second bus bar 12A has a plate shape. The thickness direction of the first bus bar 11A of the first conductive path 11, the second bus bar 12A of the second conductive path 12, and the circuit board 14 is along the thickness direction of the sealing body 24 of the semiconductor switch 13, and more specifically, is in the same direction as the thickness direction of the sealing body 24 of the semiconductor switch 13.

The first bus bar 11A includes a first arrangement portion 11B arranged to extend along the Y-direction. The second bus bar 12A has a second arrangement portion 12B arranged to extend along the Y-direction. The first arrangement portion 11B and the second arrangement portion 12B are arranged side by side with a space therebetween in the X-direction. The semiconductor switch 13 is arranged on the first arrangement portion 11B, and the exposed surface 35A of the conductor portion 35 is bonded to the first arrangement portion 11B. The bonding region of the exposed surface 35A bonded to the first arrangement portion 11B is wider than the first lead portion 31. Here, the "bonding region" refers to a region inside the outer edge of the portion where the conductor portion 35 and the first conductive path 11 are bonded to each other, and the entire region inside the outer edge may be bonded or a part of the region inside the outer edge may not be bonded.

The second arrangement portion 12B is arranged on one side of the first arrangement portion 11B in the X-direction. A surface of the second lead portion 32 on one side in the Z-direction is bonded to a surface of the second arrangement portion 12B on the other side in the Z-direction.

The first lead portion 31, the third lead portion 33, and the fourth lead portion 34 are bent and configured as follows.

The first lead portion 31 includes a first extending portion 31B extending to the other side in the Z-direction outside the sealing body 24. More specifically, the first lead portion 31 has a first protruding portion 31A protruding from the sealing body 24 to one side in the X-direction, and the first extending portion 31B extends from the distal end of the first protruding portion 31A to the other side in the Z-direction.

The third lead portion 33 includes a third extending portion 33B extending to the other side in the Z-direction outside the sealing body 24. More specifically, the third lead portion 33 includes a third protruding portion 33A protruding from the sealing body 24 to one side in the X-direction, and the third extending portion 33B extends from the distal end of the third protruding portion 33A to the other side in the Z-direction.

The fourth lead portion 34 includes a fourth extending portion 34B extending to the other side in the Z-direction outside the sealing body 24. More specifically, the fourth lead portion 34 includes a fourth protruding portion 34A protruding from the sealing body 24 to one side in the X-direction, and the fourth extending portion 34B extends from the distal end of the fourth protruding portion 34A to the other side in the Z-direction.

The first extending portion 31B, the third extending portion 33B, and the fourth extending portion 34B are bonded to the wiring pattern of the circuit board 14 by soldering or the like. The first extending portion 31B is bonded to the first voltage detection path 43. The fourth extending portion 34B is bonded to the second voltage detection path 44. In other words, the first voltage detection path 43 is electrically connected to the first electrode 21 via the first lead portion 31, and the second voltage detection path 44 is electrically connected to the second electrode 22 via the fourth lead portion 34. The third extending portion 33B selectively receives an ON signal or an OFF signal from the drive circuit 42.

The following description relates to the effects of the first embodiment.

The vehicle-mounted semiconductor switch device 1 of the first embodiment includes the semiconductor switch 13 and the voltage detection unit 45. The semiconductor switch 13 is controlled by an ON signal and an OFF signal output from the vehicle-mounted drive circuit 42, and switches between the ON state and the OFF state between the first conductive path 11 and the second conductive path 12. The semiconductor switch 13 includes a semiconductor portion 20, a first electrode 21, a second electrode 22, a third electrode 23, a sealing body 24, a first lead portion 31, a second lead portion 32, and a conductor portion 35. The third electrode 23 receives an ON signal or an OFF signal from the drive circuit 42. The sealing body 24 covers the semiconductor portion 20. The first lead portion 31 is electrically connected to the first electrode 21 and protrudes to the outside of the sealing body 24. The second lead portion 32 is electrically connected to the second electrode 22 and protrudes to the outside of the sealing body 24. The conductor portion 35 is electrically connected to the first electrode 21 and exposed to the outside of the sealing body 24. The semiconductor switch 13 is in an ON state in which a current is allowed to flow from the first electrode 21 side to the second electrode 22 side when an ON signal is input to the third electrode 23, and is in an OFF state in which a current is blocked from flowing from the first electrode 21 side to the second electrode 22 side when an OFF signal is input to the third electrode 23. The conductor portion 35 is bonded to the first conductive path 11, and the first lead portion 31 is bonded to the first voltage detection path 43. The voltage detection unit 45 detects the voltage applied to the first voltage detection path 43. According to this configuration, of the first lead portion 31 and the conductor portion 35 electrically connected to the first electrode 21, the conductor portion 35 functions as a current path, and the first lead portion 31 is used for voltage detection. Accordingly, it is easy to adopt a configuration in which the inductance component between the first electrode 21 and the first voltage detection path 43 is suppressed. In other words, according to this configuration, it is easy to adopt a configuration in which the voltage between the first electrode 21 and the second electrode 22 is detected while suppressing the influence of the counter electromotive force caused by the inductance component between the first electrode 21 and the first voltage detection path 43.

Furthermore, of the first lead portion 31 and the conductor portion 35 electrically connected to the first electrode 21, the first lead portion 31 is bonded to the first voltage detection path 43, and the conductor portion 35 is bonded to the first conductive path 11. In other words, because the first lead portion 31 which is easily bent is bonded to the first voltage detection path 43, it is possible to increase the degree of freedom of the arrangement position of the first voltage detection path 43.

Furthermore, the first lead portion 31 and the conductor portion 35 are integrally formed. In the configuration in which the first lead portion 31 and the conductor portion 35 are integrally formed, when the first lead portion 31 is bonded to the first conductive path 11 and the first voltage detection path 43 is bonded to the first lead portion 31 or the first conductive path 11, a current flows through both the conductor portion 35 and the first lead portion 31, and thus the semiconductor switch 1 is affected by a counter electromotive force caused by inductance components of both the conductor portion 35 and the first lead portion 31. In contrast, in the present configuration, the first lead portion 31 is bonded to the first voltage detection path 43, and the conductor portion 35 is bonded to the first conductive path 11, and therefore a current flowing from the first conductive path 11 to the second conductive path 12 does not pass through the first lead portion 31, and as a result, the semiconductor switch device 1 is not affected or is less likely to be affected by the counter electromotive force caused by the inductance component of the first lead portion 31. Therefore, it is possible to more reliably suppress the influence of the counter electromotive force caused by the inductance component between the first electrode 21 and the first voltage detection path 43.

Furthermore, the conductor portion 35 has a plate shape. A surface on one side in the thickness direction (one side in the Z-direction) of the conductor portion 35 is bonded to the first conductive path 11. According to this configuration, because the inductance component of the conductor portion 35 is easily suppressed, the inductance component between the first electrode 21 and the first voltage detection path 43 is easily suppressed. In addition, according to this configuration, heat generated in the semiconductor switch 13 is easily released from the conductor portion 35 to the first conductive path 11.

Furthermore, the width W1 of the exposed surface 35A of the conductor portion 35 exposed to the outside of the sealing body 24 is larger than the width W2 of the first lead portion 31. According to this configuration, because the inductance component of the conductor portion 35 is easily suppressed, the inductance component between the first electrode 21 and the first voltage detection path 43 is easily suppressed. In addition, according to this configuration, heat generated in the semiconductor switch 13 is easily released from the conductor portion 35 to the first conductive path 11.

Furthermore, the voltage detection unit 45 outputs a block signal when the voltage applied to the first voltage detection path 43 is a predetermined abnormal voltage, and the drive circuit 42 outputs an OFF signal when the block signal is input thereto. According to this configuration, it is possible to detect a voltage while suppressing the influence of the counter electromotive force caused by the inductance component between the first electrode 21 and the first voltage detection path 43, and to output an OFF signal from the drive circuit 42 when the detected voltage is an abnormal voltage. Therefore, when an abnormality occurs in the voltage of the first electrode 21, the semiconductor switch 13 can be switched to the OFF state more quickly.

Other Embodiments

The present disclosure is not limited to the embodiment described above and illustrated in the drawings. For example, the features of the embodiment described above or below can be combined in any way as long as there is no contradiction. Also, any feature of the embodiment described above or below may be omitted if not explicitly indicated as mandatory. Furthermore, the above-described embodiment may be modified as follows.

In the above embodiment, the conductor portion is a separate body from the first electrode, but the conductor portion may also be integrally formed with the first electrode by the same member. In other words, the conductor portion may also be configured as a part of the first electrode.

In the above embodiment, the conductor portion is bonded to the first conductive path, and the first lead portion is bonded to the first voltage detection path. However, the conductor portion may also be bonded to the first voltage detection path, and the first lead portion may also be bonded to the first conductive path.

It should be understood that the embodiments disclosed herein are illustrative and non-restrictive in every respect. The scope of the present disclosure is not limited to the embodiments disclosed herein, and is intended to include all modifications within the scope defined by the appended claims or within the scope equivalent to the appended claims.

The invention claimed is:

1. A vehicle-mounted semiconductor switch device comprising a semiconductor switch that is controlled by an ON signal and an OFF signal output from a vehicle-mounted drive circuit and that is switched between an ON state and an OFF state between a first conductive path and a second conductive path, the vehicle-mounted semiconductor switch device further comprising:

a voltage detection unit, wherein the semiconductor switch includes:

a semiconductor portion;

a first electrode;

a second electrode;

a third electrode to which the ON signal and the OFF signal are input from the drive circuit;

a sealing body covering the semiconductor portion;

a first lead portion electrically connected to the first electrode and protruding to the outside of the sealing body;

a second lead portion electrically connected to the second electrode and protruding to the outside of the sealing body; and a conductor portion configured as a part of the first electrode or electrically connected to the first electrode and exposed to the outside of the sealing body, the semiconductor switch is in the ON state in which the semiconductor switch allows a current to flow from the first electrode side to the second electrode side when the ON signal is input to the third electrode, and is in the OFF state in which the semiconductor switch blocks a current from flowing from the first electrode side to the second electrode side when the OFF signal is input to the third electrode, one of the conductor portion and the first lead portion is bonded to the first conductive path, and the other is bonded to a first voltage detection path, and the voltage detection unit detects a voltage applied to the first voltage detection path.

2. The vehicle-mounted semiconductor switch device according to claim 1, wherein the first lead portion is bonded to the first voltage detection path, and the conductor portion is bonded to the first conductive path.

3. The vehicle-mounted semiconductor switch device according to claim 2, wherein the first lead portion and the conductor portion are integrally formed.

4. The vehicle-mounted semiconductor switch device according to claim 3, wherein the conductor portion has a plate shape, and a surface on one side of the conductor portion in a thickness direction is bonded to the first conductive path.

5. The vehicle-mounted semiconductor switch device according to claim 3, wherein a width of an exposed surface of the conductor portion that is exposed to the outside of the sealing body is larger than a width of the first lead portion.

6. The vehicle-mounted semiconductor switch device according to claim 1, wherein the voltage detection unit outputs a block signal when the voltage applied to the first voltage detection path is a predetermined abnormal voltage, and the drive circuit outputs the OFF signal when the block signal is input thereto.

7. The vehicle-mounted semiconductor switch device according to claim 4, wherein a width of an exposed surface of the conductor portion that is exposed to the outside of the sealing body is larger than a width of the first lead portion.

8. The vehicle-mounted semiconductor switch device according to claim 2, wherein the voltage detection unit outputs a block signal when the voltage applied to the first voltage detection path is a predetermined abnormal voltage, and the drive circuit outputs the OFF signal when the block signal is input thereto.

9. The vehicle-mounted semiconductor switch device according to claim 3, wherein the voltage detection unit outputs a block signal when the voltage applied to the first voltage detection path is a predetermined abnormal voltage, and the drive circuit outputs the OFF signal when the block signal is input thereto.

10. The vehicle-mounted semiconductor switch device according to claim 4, wherein the voltage detection unit outputs a block signal when the voltage applied to the first voltage detection path is a predetermined abnormal voltage, and the drive circuit outputs the OFF signal when the block signal is input thereto.

11. The vehicle-mounted semiconductor switch device according to claim 5, wherein the voltage detection unit outputs a block signal when the voltage applied to the first voltage detection path is a predetermined abnormal voltage, and the drive circuit outputs the OFF signal when the block signal is input thereto.

* * * * *